US012606910B2

(12) United States Patent
Harada et al.

(10) Patent No.: US 12,606,910 B2
(45) Date of Patent: Apr. 21, 2026

(54) SUBSTRATE PROCESSING APPARATUS, PROCESSING GAS CONCENTRATING APPARATUS, AND SUBSTRATE PROCESSING METHOD

(71) Applicant: Tokyo Electron Limited, Tokyo (JP)

(72) Inventors: Muneo Harada, Osaka (JP); Tsuneyuki Okabe, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 420 days.

(21) Appl. No.: 17/773,985

(22) PCT Filed: Oct. 26, 2020

(86) PCT No.: PCT/JP2020/040116
§ 371 (c)(1),
(2) Date: May 3, 2022

(87) PCT Pub. No.: WO2021/090723
PCT Pub. Date: May 14, 2021

(65) Prior Publication Data
US 2022/0372623 A1　　Nov. 24, 2022

(30) Foreign Application Priority Data
Nov. 5, 2019　(JP) ................................. 2019-200886

(51) Int. Cl.
C23C 16/44 (2006.01)
C23C 16/448 (2006.01)
(Continued)

(52) U.S. Cl.
CPC .... C23C 16/45527 (2013.01); C23C 16/4481 (2013.01); C23C 16/46 (2013.01)

(58) Field of Classification Search
CPC .......... C23C 16/45527; C23C 16/4481; C23C 16/46; C23C 16/4483; C23C 16/303;
(Continued)

(56) References Cited

U.S. PATENT DOCUMENTS 11,661,654 B2 * 5/2023 Chandrasekharan ........................
C23C 16/45561
118/723 ME
2007/0151452 A1 * 7/2007 Giacobbe ................. B01J 20/10
95/143
(Continued)

FOREIGN PATENT DOCUMENTS

JP　　2001-220677 A　　8/2001
JP　　2003-342260 A　　12/2003
(Continued)

OTHER PUBLICATIONS

International Search Report issued on Dec. 28, 2020 for WO 2021/090723 A1 (6 pages).

*Primary Examiner* — Rudy Zervigon
(74) *Attorney, Agent, or Firm* — Venjuris, P.C.

(57) ABSTRACT
A substrate processing apparatus includes: a chamber; a raw material tank in which a raw material of a processing gas is accommodated; a carrier gas supply unit that supplies a carrier gas to the raw material tank; a mixed gas flow path connected to the raw material tank, and through which a mixed gas of the processing gas obtained from the raw material of the processing gas and the carrier gas flows therethrough; a concentration tank connected to a downstream of the mixed gas flow path, accommodating a porous member including a metal-organic framework; a desorption mechanism that desorbs the processing gas adsorbed to the porous member; and a concentration gas flow path that allows the processing gas desorbed from the porous member to flow to the chamber.

11 Claims, 7 Drawing Sheets

(51) Int. Cl.
     *C23C 16/455*       (2006.01)
     *C23C 16/46*        (2006.01)

(58) Field of Classification Search
     CPC ............ C23C 16/45544; C23C 16/448; C23C
            16/455; C23C 16/45561; C23C 16/4482;
            C23C 16/52; C23C 16/4408; C23C
            16/45525; C23C 16/4583; B01J 20/00;
            B01J 20/26; B01J 20/34; B01J 20/226;
            B01J 4/008; C07C 63/28; C07C 63/307;
            C07C 63/42; H01L 21/285; H01L
            21/67017; H01L 21/6715; H01L
            21/67161; H01L 21/67739; H01L
            21/02312; H01L 21/02263; H01L
            21/02337; H01L 21/3065; H01L
            21/67207; B01D 53/04; C07F 1/08; C07F
            5/00; C07F 11/00; C07F 15/02; Y10T
            137/0329; G05D 11/132; G05D 11/138;
            G01F 1/00; G01F 23/2927; G01F 3/00;
            G01F 23/0007; G01F 23/04; H01J
            37/32449; C30B 25/08; C30B 29/403;
            C30B 25/14; C30B 25/165; B67D
            7/3263; B67D 7/0238
     USPC .......... 137/88, 2, 109; 118/715; 156/345.33,
            156/345.34
     See application file for complete search history.

(56) References Cited

U.S. PATENT DOCUMENTS

| | | | | |
|---|---|---|---|---|
| 2007/0155138 A1* | 7/2007 | Tomasini | .......... | H01L 21/02532 |
| | | | | 438/483 |
| 2008/0191153 A1* | 8/2008 | Marganski | .............. | C23C 14/48 |
| | | | | 134/107 |
| 2009/0087566 A1* | 4/2009 | Kimura | ............. | H01L 21/67057 |
| | | | | 427/299 |
| 2010/0003807 A1* | 1/2010 | Nagaseki | .......... | H01L 21/30604 |
| | | | | 438/758 |
| 2014/0290859 A1* | 10/2014 | Kobayashi | ........ | H01L 21/67017 |
| | | | | 156/345.15 |

FOREIGN PATENT DOCUMENTS

| | | | |
|---|---|---|---|
| JP | 5305279 | B2 | 10/2013 |
| JP | 2014-083482 | A | 5/2014 |
| JP | 2014-198872 | A | 10/2014 |
| JP | 5656186 | B2 | 1/2015 |
| JP | 2015-165569 | A | 9/2015 |
| JP | 2015-215125 | A | 12/2015 |
| JP | 2018-500157 | A | 1/2018 |
| JP | 2018-021008 | A | 2/2018 |

* cited by examiner

SUBSTRATE PROCESSING APPARATUS, PROCESSING GAS CONCENTRATING APPARATUS, AND SUBSTRATE PROCESSING METHOD

CROSS REFERENCE TO RELATED APPLICATIONS

This application is a national phase of PCT application No. PCT/JP2020/040116, filed on 26 Oct. 2020, which claims priority from Japanese patent application No. 2019-200886, filed on 5 Nov. 2019, all of which are incorporated herein by reference.

TECHNICAL FIELD

Embodiments disclosed related to a substrate processing apparatus, a processing gas concentrating apparatus, and a substrate processing method.

BACKGROUND

In the semiconductor process of next-generation, there is an increasing need to form a thin film of, for example, a metal or a metal compound on a substrate. The thin film may be formed, for example, by an atomic layer deposition (ALD) method or a chemical vapor deposition (CVD) method. The ALD method or the CVD method is a technique in which a raw material gas, which is a processing gas, is supplied to a substrate placed in a processing chamber to form a thin film on the substrate. As an example of the technique for supplying the raw material gas to the processing chamber, Patent Document 1 proposes that the raw material gas is temporarily stored in a storage unit and then discharged from a pressure-boosted storage unit to the processing chamber.

Patent Document 2 discloses a porous metal complex having a hydrogen occlusion capability, which is formed by accumulating a plurality of metal complexes composed of a coordinate bond between aluminum ions and aromatic carboxylic acid. Further, Patent Document 3 discloses a porous metal complex having an occlusion capability of, for example, hydrogen, methane, carbon dioxide, which is formed by accumulating a plurality of metal complexes composed of a coordinate bond between trivalent metal ions and aromatic tricarboxylic acid. Further, Patent Document 4 discloses a gas storage and supply system including a gas storage tank filled with a gas storage material capable of reversely occluding and releasing a gas such as hydrogen, ammonia, or methane.

PRIOR ART DOCUMENT

Patent Document

Patent Document 1: Japanese Patent Laid-Open Publication No. 2014-198872
Patent Document 2: Japanese Patent No. 5305279
Patent Document 3: Japanese Patent No. 5656186
Patent Document 4: Japanese Patent Laid-Open Publication No. 2015-215125

SUMMARY OF THE INVENTION

Problems to be Solved

The present disclosure is to provide a technique capable of supplying a processing gas having a high concentration to a substrate for manufacturing a semiconductor device when supplying a processing gas for processing the substrate.

Means to Solve the Problems

The present disclosure relates a substrate processing apparatus that manufactures a semiconductor device, the substrate processing apparatus including:
a chamber in which a substrate is accommodated;
a raw material tank in which a raw material of a processing gas for processing the substrate is accommodated;
a carrier gas supply unit configured to supply a carrier gas to the raw material tank;
a mixed gas flow path connected to the raw material tank, and through which a mixed gas of the processing gas obtained from the raw material of the processing gas and the carrier gas flows;
a concentration tank connected to a downstream of the mixed gas flow path and in which a porous member containing a metal-organic framework configured such that the processing gas contained in the mixed gas is preferentially adsorbed are accommodated;
a desorption mechanism configured to desorb the processing gas adsorbed to the porous member; and
a concentration gas flow path provided between the concentration tank and the chamber, and through which the processing gas desorbed from the porous member is supplied to the chamber.

Effect of the Invention

According to the present disclosure, it is possible to supply a processing gas having a high concentration to a substrate for manufacturing a semiconductor device when supplying a processing gas for processing the substrate.

DETAILED DESCRIPTION TO EXECUTE THE INVENTION

Figure 1:
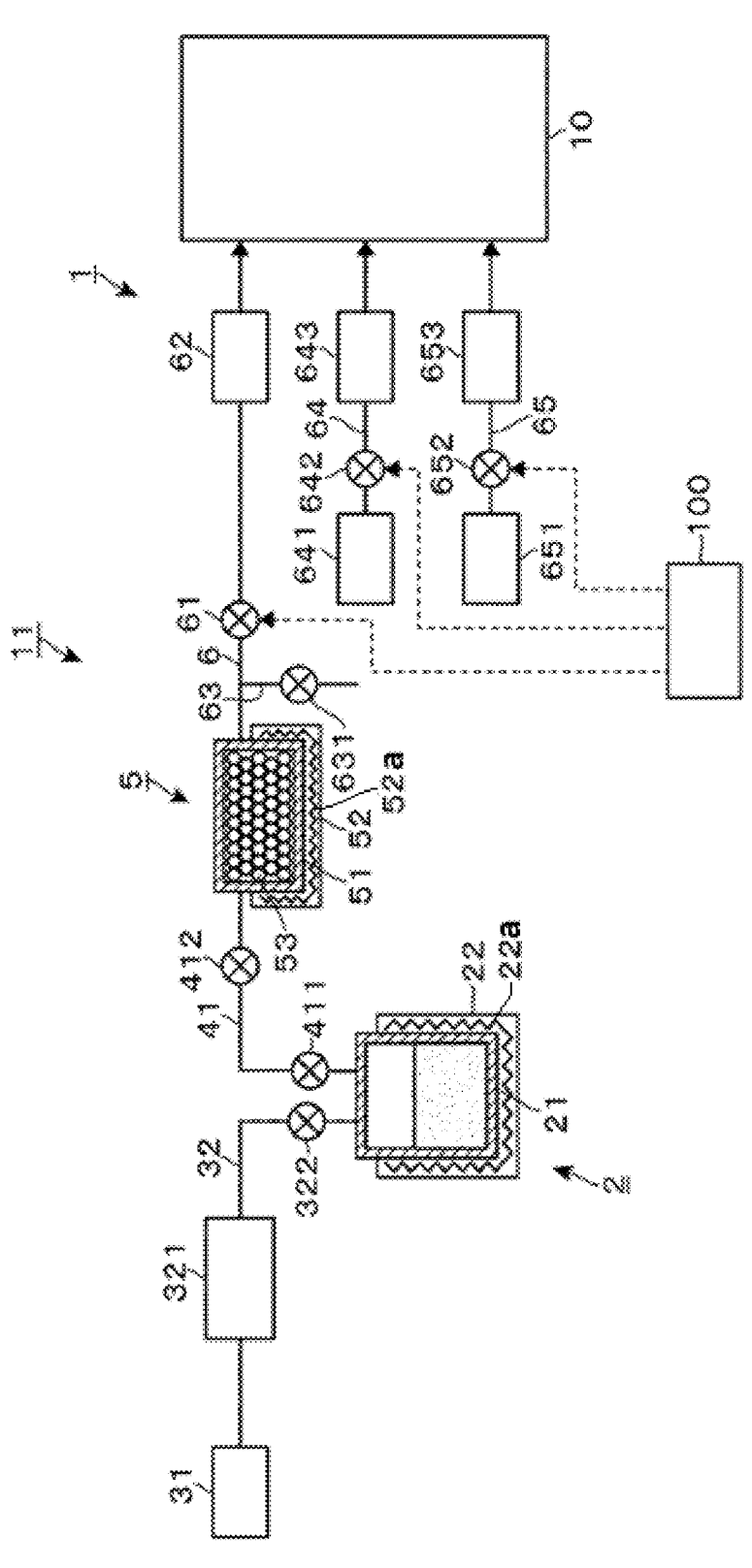
-FIG. 1 is a configuration view illustrating a film forming apparatus according to an embodiment of the present disclosure.

Descriptions will be made on a first embodiment of a film forming apparatus which is a substrate processing apparatus of the present disclosure with reference to FIGS. 1 to 4. A substrate is for manufacturing a semiconductor device. Hereinafter, descriptions will be made on a film forming apparatus 1 that performs a processing in which a film is formed on a semiconductor wafer (hereinafter, referred to as a "wafer") serving as a substrate. The film forming apparatus 1 includes a chamber 10 that accommodates a wafer on which a film is formed, and a gas supply system 11 that supplies a raw material gas which is a raw material of the film to the chamber 10 as a processing gas. As described above, in the film formation processing of the wafer, the processing gas is the raw material gas, and the raw material of the processing gas is a raw material of the film formed on the wafer.

The gas supply system 11 includes a raw material tank 2, and the raw material tank 2 contains a raw material 21 of a film, which is liquid or solid. As the raw material 21 of the film, a metal compound may be used. Here, a case where aluminum chloride ($AlCl_3$), which is a metal halide, is used as the raw material 21 will be described as an example. $AlCl_3$ is solid at normal temperature, and the raw material tank 2 includes a vaporization mechanism 22 that vaporizes the raw material 21. The vaporization mechanism 22 in this example is a raw material heating mechanism including a heater 22a provided around the raw material tank 2. The solid $AlCl_3$ in the raw material tank 2 is heated to a temperature at which $AlCl_3$ is vaporized and is not thermally decomposed, for example, 125° C., by the raw material heating mechanism, and is vaporized to become the raw material gas.

The raw material tank 2 is configured to be supplied with a carrier gas such as argon (Ar) gas from a carrier gas supply unit. As the carrier gas, an inert gas such as nitrogen ($N_2$) gas may be used, in addition to Ar gas. For example, the carrier gas supply unit includes a carrier gas supply source 31 and a carrier gas supply path 32. The carrier gas supply path 32 is provided with a flow rate regulator 321 and a valve 322. The raw material gas is generated by vaporizing $AlCl_3$ in the raw material tank 2. When the carrier gas is supplied into the raw material tank 2, a mixed gas containing the raw material gas and the carrier gas is obtained.

Further, a mixed gas flow path 41 is connected to the raw material tank 2. The mixed gas flows through the mixed gas flow path 41. A concentration tank 51 of a raw material gas concentrating apparatus 5 is connected to the downstream of the mixed gas flow path 41 via valves 411 and 412. The valve 322 is a valve for the supply/stop of the carrier gas, and the valves 411 and 412 are valves for the supply/stop of the mixed gas.

The raw material gas concentrating apparatus 5 has a function of concentrating the raw material gas contained in the mixed gas, and includes the concentration tank 51 and a desorption mechanism 52 (to be described later). The concentration tank 51 is constituted by, for example, a metal container, and accommodates a porous member 53 therein. The porous member 53 includes a metal-organic framework (MOF) configured to preferentially adsorb the raw material gas contained in the mixed gas. The metal-organic framework is also referred to as a porous coordination polymer (PCP). The metal-organic framework contains a metal complex composed of a coordinate bond between a metal ion and organic ligands (organic compounds), and has a pore structure formed by accumulating a plurality of metal complexes.

In the metal-organic framework, metal ions are connected by cross-linkable organic ligands by the coordinate bond between the metal ion and the organic ligands, and a crystalline polymer structure having a space therein is formed. In the metal-organic framework formed by accumulating a plurality of metal complexes, the metal ions and the organic ligands are regularly bonded. Therefore, for

Figures 2A, 2B:
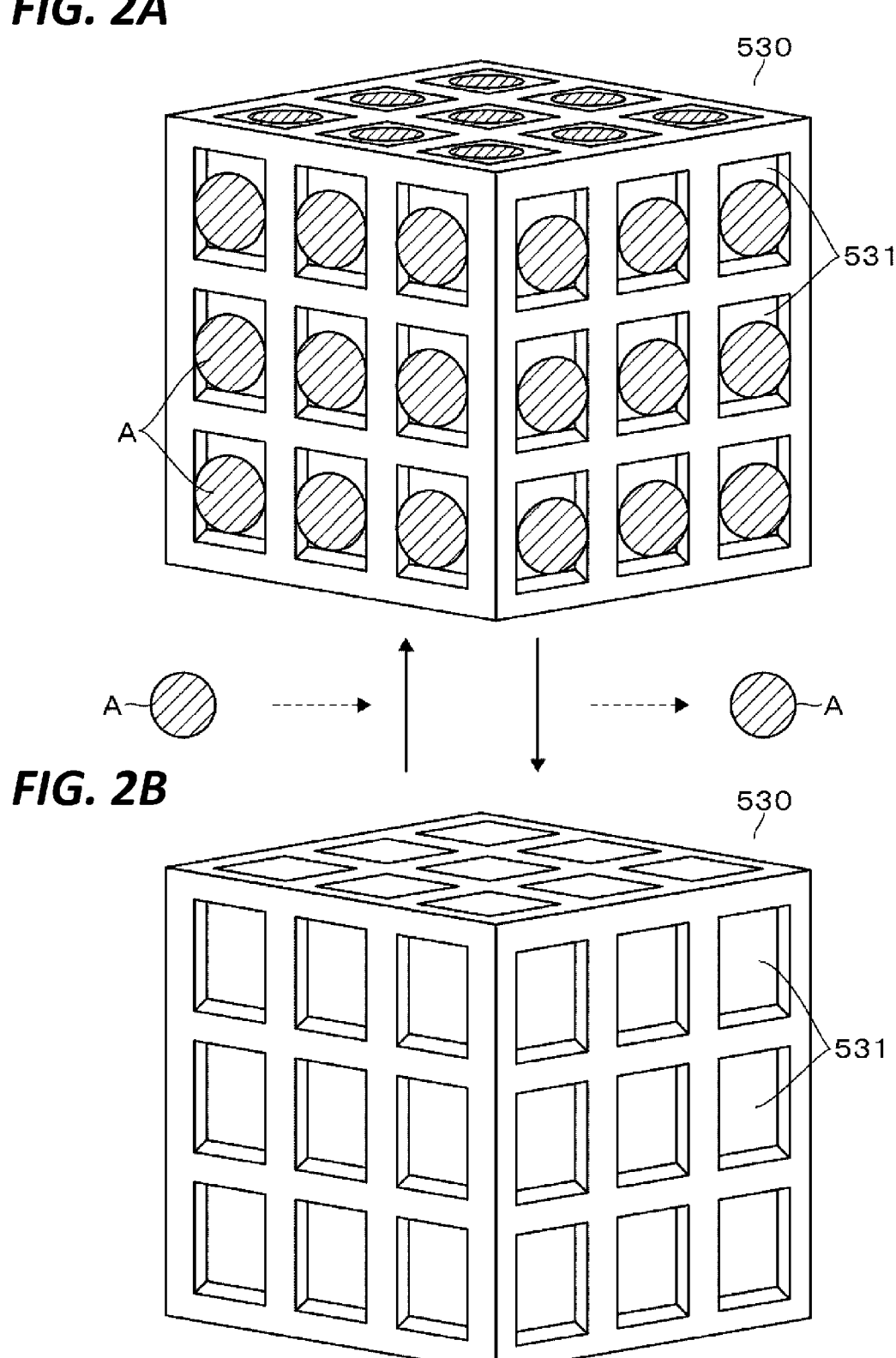
FIGS. 2A and 2B are schematic views illustrating an example of a porous member accommodated in a concentration tank of the film forming apparatus.

4 example, as schematically illustrated in FIGS. 2A and 2B, a metal-organic framework 530 has a structure in which nanometer-sized pores 531 are regularly and sterically arranged. With respect to such a metal-organic framework 530, the raw material gas is adsorbed such that one or a plurality of molecules A of the raw material gas enter one pore 531 (see FIG. 2A). Although briefly described for convenience of illustration, the pores 531 are regularly formed inside the metal-organic framework 530 schematically illustrated in FIGS. 2A and 2B. Then, the molecules A of the raw material gas may be adsorbed in the pores 531 inside the metal-organic framework 530.

A solution method, which is one of the methods for producing the metal-organic framework, is a method in which a solution of metal ions and organic ligands are mixed under normal temperature and normal pressure to form a metal-organic framework, and the accumulation of the metal complexes proceeds in a self-assembly manner in the solution. As described above, the metal-organic framework is relatively easy to produce, and the size or the shape of the pore 531 may be controlled by selecting the metal ion and the organic ligand and adjusting the synthesis condition, and thus, the degree of freedom is also high.

In the example, the pores 531 of the metal-organic framework that constitutes the porous member 53 are designed according to the size of the $AlCl_3$ molecule so that $AlCl_3$, which is the raw material gas, is preferentially adsorbed compared to the carrier gas. Here, the term that the metal-organic framework preferentially adsorbs the raw material gas contained in the mixed gas refers to the fact that, for example, when the mixed gas is supplied to the metal-organic framework in a state where the partial pressures of the raw material gas and the carrier gas are equal to each other, the adsorbed amount of the raw material gas molecules is larger than the adsorbed amount of the carrier gas molecules. In other words, the raw material gas is selectively adsorbed to the metal-organic framework compared to the carrier gas. Therefore, in addition to the raw material gas molecules, the carrier gas molecules may be adsorbed to the metal-organic framework.

When the mixed gas flows into the concentration tank 51 filled with the porous member 53 having the above-described configuration, as illustrated in FIG. 2A, $AlCl_3$ enters and is adsorbed in the pores 531 of the metal-organic framework 530 that constitutes the porous member 53. As described above, since the pores 531 have a nanometer size and are formed at a high density, each pore 531 may accommodate the $AlCl_3$ molecule and a large amount of the raw material gas may be adsorbed and stored at a high density.

Further, at this time, the $AlCl_3$ molecules are confined to the pores 531 of the porous members 53 while maintaining the molecular structure of the gas. Meanwhile, as described above, the metal-organic framework is configured such that the $AlCl_3$ molecule, which is the raw material gas, is preferentially adsorbed. As a result, the carrier gas molecules may not be adsorbed to the porous member 53, or partially adsorbed, but most of them are not adsorbed and pass through the porous member 53. As a result, in the concentration tank 51, the concentration of the raw material gas is increased as compared to the mixed gas before being supplied to the concentration tank 51, and the raw material gas is concentrated.

There may be an example, in which the metal-organic framework that constitutes the porous member 53 is selected from a group of metal-organic frameworks described in the following (a) to (d).

(a) a metal-organic framework having a pore structure formed by accumulating a plurality of metal complexes each composed of a coordinate bond between a copper ion and 1,3,5-benzenetricarboxylic acid, (b) a metal-organic framework having a pore structure formed by accumulating a plurality of metal complexes each composed of a coordinate bond between an iron ion and 1,3,5-benzenetricarboxylic acid, (c) a metal-organic framework having a pore structure formed by accumulating a plurality of metal complexes each composed of a coordinate bond between a chromium ion and terephthalic acid, and (d) a metal-organic framework having a pore structure formed by accumulating a plurality of metal complexes each composed of a coordinate bond between a lanthanum ion and 1,3,5-tris(4-carboxyphenyl)benzene.

The porous member 53 containing the metal-organic framework is formed into pellets or powders, or granules smaller than the pellets, and is filled in the concentration tank 51. In this manner, a packed bed through which the gas passes is provided in the concentration tank 51. The porous member 53 may be constituted by only the metal-organic framework, or may include, for example, a molding aid for molding the metal-organic framework into pellets or granules, in addition to the metal-organic framework.

In the following description, the porous member 53 and the metal-organic framework that constitutes the porous member 53 are not distinguished from each other, and terms such as "pores of the porous member 53" or "adsorption to the porous member 53" may be used.

Further, the concentration tank 51 of the raw material gas concentrating apparatus 5 is provided with the desorption mechanism 52 configured to desorb the raw material gas adsorbed to the porous member 53. The desorption mechanism 52 in this example is a porous member heating mechanism configured to heat the porous member 53 in the concentration tank 51 to desorb the raw material gas adsorbed to the porous member 53. The porous member heating mechanism is constituted by, for example a heater 52a, and is provided around the concentration tank 51.

As described above, since the raw material gas is adsorbed so as to enter the pores 531 of the porous member 53, the adsorption energy between the raw material gas and the porous member 53 is relatively small. Therefore, by heating the porous member 53 at a relatively low temperature at which the raw material gas is not thermally decomposed, as illustrated in FIG. 2B, the raw material gas may be easily desorbed from the metal-organic framework 530.

Here, as described above, the raw material gas is preferentially adsorbed to the porous member 53. Therefore, even when the carrier gas molecules adsorbed to the porous member 53 are desorbed by the heating, the carrier gas concentration in the gas generated by the desorption is lower than the carrier gas concentration in the mixed gas supplied to the concentration tank 51. Hereinafter, the gas obtained by the desorption from the porous member 53 may be called as a concentration gas.

Further, a concentration tank 51 is connected to the chamber 10 via a concentration gas flow path 6. The chamber 10 accommodates a wafer W on which a film is formed, for example, includes a stage on which the wafer W is placed, and is connected to an exhaust mechanism via an exhaust path. In FIG. 1, the illustration of the stage, the exhaust path, or the exhaust mechanism is omitted.

The concentration gas flow path 6 is a flow path configured to supply the raw material gas desorbed from the porous member 53 to the chamber 10. As described above, the concentration gas containing the raw material gas desorbed from the porous member 53 flows through the concentration gas flow path 6. The concentration gas flowing through the concentration gas flow path 6 has a higher concentration of the raw material gas in the mixed gas than that of the mixed gas flowing through the mixed gas flow path 41 on the upstream side of the concentration tank 51.

The concentration gas flow path 6 includes a raw material gas supply/stop valve 61 configured to supply and stop the raw material gas to the chamber 10, and a flow rate regulator 62 configured to regulate the flow rate of the raw material gas.

Further, a discharge path 63 configured to discharge the carrier gas is connected to the upstream side of the raw material gas supply/stop valve 62 in the concentration gas flow path 6, and the discharge path 63 includes a valve 631. The discharge path 63 is connected to the exhaust mechanism (not illustrated).

The film forming apparatus 1 in the example is configured to form a thin film by the ALD method, and further includes a reaction gas supply unit and a purge gas supply unit.

The reaction gas supply unit is configured to supply a reaction gas to the chamber 10, and includes a supply source 641 of the reaction gas and a reaction gas supply path 64 through which the reaction gas is supplied from the supply source 641 to the chamber 10. The reaction gas is a gas that reacts with the raw material gas to form a film, and, for example, an ammonia ($NH_3$) gas that produces aluminum nitride (AlN) by reacting with $AlCl_3$ is used. For example, the reaction gas flow path 64 includes a reaction gas supply/stop valve 642 configured to supply and stop the reaction gas, and a flow rate regulator 643 that regulates the flow rate of the reaction gas.

The purge gas supply unit includes a purge gas supply path 65 through which a purge gas from supply source 651 of a purge gas, for example, a nitrogen ($N_2$) gas to the chamber 10. For example, the purge gas flow path 65 is provided with a purge gas supply/stop valve 652 configured to supply and stop the purge gas, and a flow rate regulator 653 that regulates the flow rate of the purge gas. In this example, valves configured to be automatically opened and closed are used for all valves.

Further, the film forming apparatus 1 includes a controller 100. The controller 100 is constituted by a computer including a CPU and a storage unit, and controls each part of the film forming apparatus 1. A program in which a group of steps (instructions) for executing an operation required for a film formation processing of the wafer W is formed is recorded in the storage unit. Further, for example, the controller 100 is configured to control the opening and closing operation of the raw material gas supply/stop valve 61, the reaction gas supply/stop valve 642, and the purge gas supply/stop valve 652 so that the raw material gas and the reaction gas are alternately supplied to the chamber 10. The program is stored in a storage medium such as, for example, a hard disk, a compact disk, a magneto optical disk, or a memory card, and installed into the computer therefrom.

Subsequently, a method for forming a film on the wafer W performed by the film forming apparatus 1 will be described. First, a step of vaporizing the raw material is performed in the raw material tank 2 containing $AlCl_3$, which is the raw material of the film. In this step, for example, in a state where the valves 322 and 411 are opened, the raw material tank 2 is heated to the temperature at which the solid $AlCl_3$ is vaporized, for example, 125° C., by the vaporization mechanism (raw material heating mechanism) 22.

Next, in parallel with the step of vaporizing, a step of supplying the carrier gas to the raw material tank 2 to obtain the mixed gas of the raw material gas and the carrier gas is performed. That is, the carrier gas is supplied to the raw material tank 2 via the carrier gas supply path 32. Therefore, in the raw material tank 2, the raw material gas and the carrier gas are mixed to produce the mixed gas.

Figure 3:
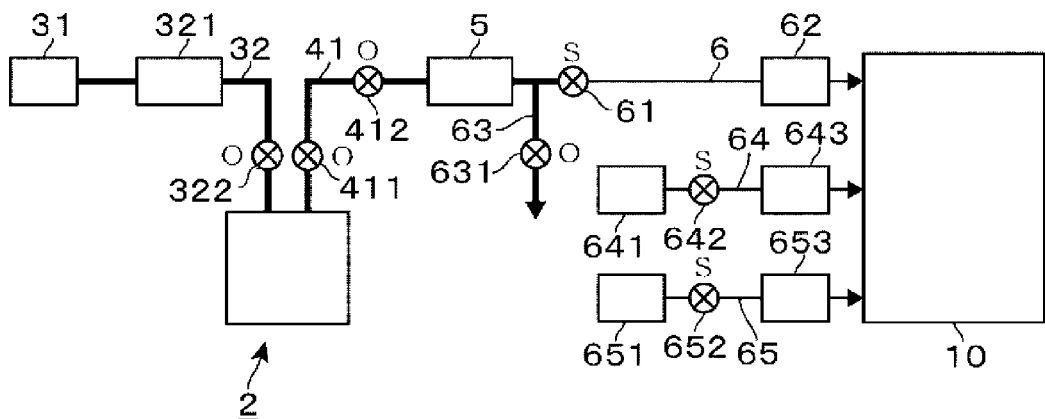
FIG. 3 is a first operation view of the film forming apparatus.
Figure 4:
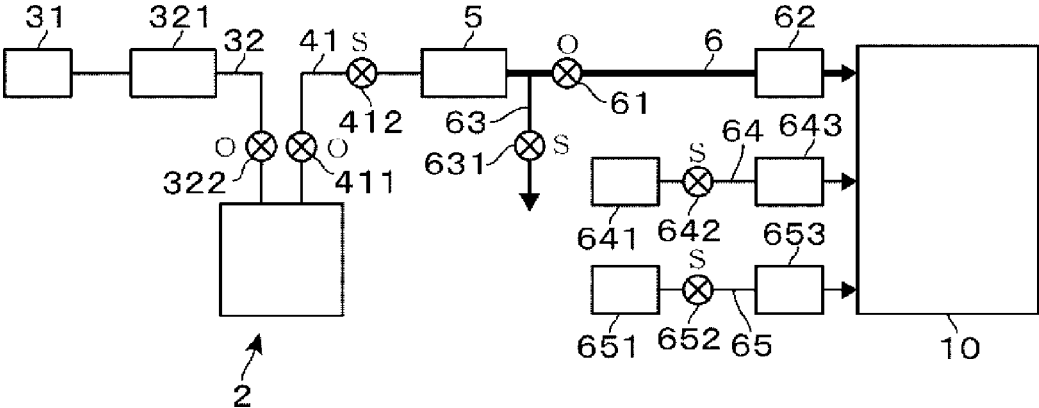
FIG. 4 is a second operation view of the film forming apparatus.

Subsequently, a step of supplying the mixed gas to the concentration tank 51 so that the raw material gas in the mixed gas is preferentially adsorbed to the porous member 53 is performed. For example, in this step, as illustrated in FIG. 3, the valves 322, 411, 412, and 631 are opened, and the other valves are closed, and then, the mixed gas is flowing from the raw material tank 2 to the concentration tank 51. Therefore, the raw material gas in the mixed gas is adsorbed to the porous member 53, and the carrier gas that passes through the porous member 53 without being adsorbed is discharged via the discharge path 63. In FIGS. 3 and 4, the state where the valve is opened is indicated by "0," and the state where the valve is closed is indicated by "5," respectively, and the flow path through which the gas is flowing is indicated by a thick line. Further, in a step of preferentially adsorbing the raw material gas, the valve 412 is opened, but both the valves 61 and 631 are closed, and then, the mixed gas may be supplied to the concentration tank 51 in a state where the outlet is closed so that the raw material gas is adsorbed to the porous member 53. In this case, for example, after the adsorption, the valve 631 is opened, and the carrier gas that is not adsorbed to the porous member 53 is discharged to the discharge path 63.

Subsequently, a step of desorbing the raw material gas adsorbed to the porous member 53 is performed. That is, the valves 61, 631, and 412 are closed, and the concentration tank 51 is heated to the temperature at which the raw material gas is desorbed from the porous member 53 by the desorption mechanism (porous member heating mechanism) 52 to desorb the raw material gas adsorbed to the porous member 53.

Thereafter, a step of supplying the concentration gas containing the desorbed raw material gas to the chamber 10 in which the wafer W is accommodated to form a film on the wafer W is performed. The wafer W is placed on the stage in the chamber 10, and when the film is formed by the ALD method, first, the inside of the chamber 10 is exhausted by the exhaust mechanism to adjust the pressure at the time of film formation. Then, as illustrated in FIG. 4, the raw material gas supply/stop valve 61 is opened, and the other valves are closed, and then, the concentration gas is supplied to the chamber 10 so that the raw material gas is adsorbed to the surface of the wafer W.

The desorption of the raw material gas and the supply of the concentration gas to the chamber 10 may be performed at the same time. In this case, as illustrated in FIG. 4, the porous member 53 is heated in the state where the raw material supply/stop valve 61 is opened, and the desorbed raw material gas is supplied to the chamber 10 as it is.

Subsequently, the purge gas supply/stop valve 652 is opened, and the other valves are closed, and then, the purge gas is supplied to the chamber 10 so that the raw material gas in the chamber 10 is replaced with the purge gas. Subsequently, the reaction gas supply/stop valve 642 is opened, and the other valves are closed, and then, the reaction gas is supplied to the chamber 10. Therefore, the raw material gas adsorbed to the surface of the wafer and the reaction gas react with each other to form a single molecular layer of AlN. Thereafter, the purge gas supply/stop valve 652 is opened, and the other valves are closed, and then, the purge gas is supplied to the chamber 10 so that the reaction gas in the chamber 10 is replaced with the purge gas.

In this manner, the opening and closing operation of each of the supply/stop valves 61, 642, and 652 of the raw material gas, the reaction gas, and the purge gas is controlled so that the raw material gas and the reaction gas are alternately supplied to the chamber 10 in the order of the raw material gas→the purge gas→the reaction gas→the purge gas. Then, the supply of the raw material gas and the reaction gas is repeated to form an AlN film having a desired thickness.

Figure 9:
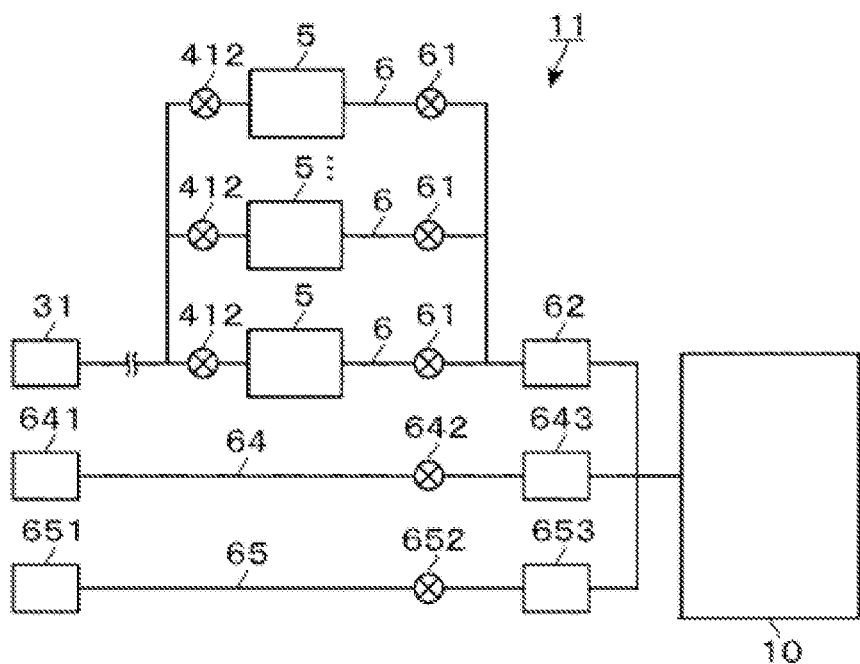
FIG. 9 is a configuration view illustrating another example of the film forming apparatus.

In the above, a step of adsorbing the raw material gas to the porous member 53 in the concentration tank 51 may be completed before a step of forming a film on the wafer W is initiated, that is, before the step of desorbing the raw material gas from the porous member 53 is performed. As a result, the filling amount of the porous member 53 filled in the concentration tank 51 is set to, for example, an amount capable of adsorbing the raw material gas capable of forming a film on all the wafers in one lot in the step of forming the film on the wafer W. Further, when it takes time to adsorb the raw material gas to the porous member 53, a plurality of concentration tanks 51 may be prepared, as shown in FIG. 9, so that the adsorption of the raw material gas to the porous member 53 is performed in parallel in the plurality of concentration tanks 51. In this case, by sequentially switching the concentration tank 51 connected to the concentration gas flow path 6, the raw material gas may be adsorbed to the porous member 53 in the other concentration tank 51 while supplying the raw material gas to the chamber 10.

According to the embodiment, the mixed gas of the raw material gas and the carrier gas flows to the concentration tank 51 so that the raw material gas is selectively adsorbed to the porous member 53. Subsequently, the raw material gas is desorbed from the porous member 53 and is supplied to the chamber 10. Since the raw material gas is adsorbed to and stored in the porous member 53 at a high density, the gas desorbed from the porous member 53 is a concentrated gas (concentration gas) having a high concentration of the raw material gas. As described above, in the concentration tank 51, a large amount of the raw material gas may be selectively adsorbed and stored, and be desorbed at an arbitrarily timing when it is desired to be used. Therefore, the raw material gas may be used without being limited by the vaporization rate of the raw material gas. Further, when a film is formed on the wafer W in the chamber 10, it is possible to supply the concentration gas having a high concentration of the raw material gas to the chamber 10. As a result, it is possible to supply the gas flow rate of the raw material gas sufficient to be adsorbed to the wafer W in a short time, and the productivity of the film formation processing is improved.

In the raw material containing a metal such as a metal halide, since the molecules have strong interactions with each other, a saturated vapor pressure is low, and it is difficult to be vaporized. Meanwhile, when the raw material is heated at a high temperature in order to increase the amount of vaporization, the component of the raw material may be thermally decomposed, and thus, the heating temperature is limited. Further, in the method in which the carrier gas is supplied to the raw material gas so that the mixed gas of the carrier gas and the raw material gas flows to the chamber 10, it is difficult to increase the concentration of the raw material gas in the mixed gas because it is diluted with the carrier gas. Therefore, a sufficient gas flow rate of the raw material gas may not be secured at the time of the film formation processing, and thus, the productivity may be lowered. Particularly, when the film is formed by alternately supplying the raw material gas and the reaction gas to the chamber 10 by the ALD method, the raw material gas may not be supplied at a sufficient flow rate at the supply time band of the raw material gas, and thus, the film formation rate tends to decrease. Therefore, the method of the present disclosure is particularly effective when the film is formed using a raw material 21 having a low saturated vapor pressure and being difficult to be vaporized. Although it varies depending on conditions such as the supply flow rate of the raw material gas or the carrier gas and the process pressure in the chamber 10, appropriately, there may be a case where a substance having a saturated vapor pressure of 26.7 kPa or less at 100° C. is used as the raw material 21.

Further, the desorption of the raw material gas from the porous member 53 may be performed by a simple method in which the porous member 53 are heated by the porous member heating mechanism that constitutes the desorption mechanism 52. As a result, it is possible to efficiently desorb the raw material gas from the porous member 53 in a short time, and without thermally decomposing the raw material molecules.

As described above, the metal-organic framework that constitutes the porous member 53 may be designed such that the size or the shape of the pore 531 is easily designed and the gas which is the adsorption target is selectively adsorbed, as compared with other porous members such as activated carbon or zeolite.

Further, as will be seen from an evaluation test (to be described later), it is confirmed that the porous member 53 containing metal complexes composed of a coordinate bond between copper ions and 1,3,5-benzenetricarboxylic acid, a coordinate bond between iron ions and 1,3,5-benzenetricar-boxylic acid, a coordinate bond between chromium ions and terephthalic acid, and a coordinate bond between lanthanum ions and 1,3,5-tris(4-carboxyphenyl)benzene, respectively, may actually adsorb the raw material gas containing $AlCl_3$.

Subsequently, descriptions will be briefly made on an example of the configuration of the film forming apparatus including the gas supply system 11 provided with the raw material gas concentrating apparatus 5 with reference to FIGS. 5 to 7. In these drawings, the same components as those of the film forming apparatus 1 illustrated in FIG. 1 are designated by the same reference numerals, and the description thereof will be omitted.

Figure 5:
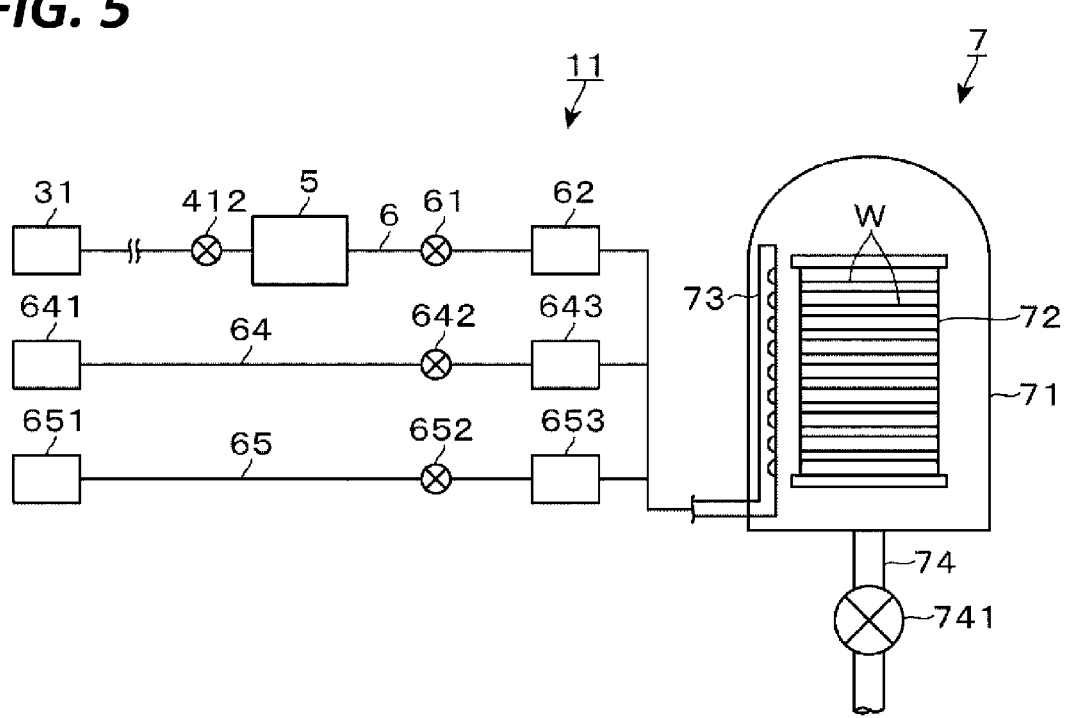
FIG. 5 is a configuration view illustrating another example of the film forming apparatus.

FIG. 5 illustrates an example in which a chamber 71 of a film forming apparatus 7, which is a batch type, is connected to the gas supply system 11 as the chamber 10 illustrated in FIG. 1. The chamber 71 including a vacuum container that is vertically long accommodates a wafer boat 72 in which the wafers W are placed in multiple stages. The chamber 71 is connected to the exhaust mechanism (not illustrated) via an exhaust path 74 provided with a valve 741. Further, a gas nozzle 73 extending along the longitudinal direction of the wafer boat 72 is provided on the side of the wafer boat 72 when the wafer boat 72 is accommodated in the chamber 71.

The gas nozzle 73 is configured to supply the concentrated raw material gas from the concentration tank 51 of the raw material gas concentrating apparatus 5 via the gas supply system 11 of the raw material gas of the present disclosure. In the embodiment described above, the gas supply system 11 is configured as the same as the configuration illustrated in FIG. 1. However, in FIG. 5, the illustration of the configuration between the carrier gas supply source 31 and the valve 412 is omitted. Further, the gas nozzle 73 is connected to each of the supply source 641 of the reaction gas via the reaction gas supply path 64 and the supply source 651 of the purge gas via the purge gas supply path 65. Similarly to the example described with reference to FIG. 4, in the film forming apparatus 7, the raw material gas and the reaction gas are alternately supplied from the gas nozzle 73 into the chamber 71, and a thin film containing, for example, AlN, is formed on the wafer W by the ALD method.

Figure 6:
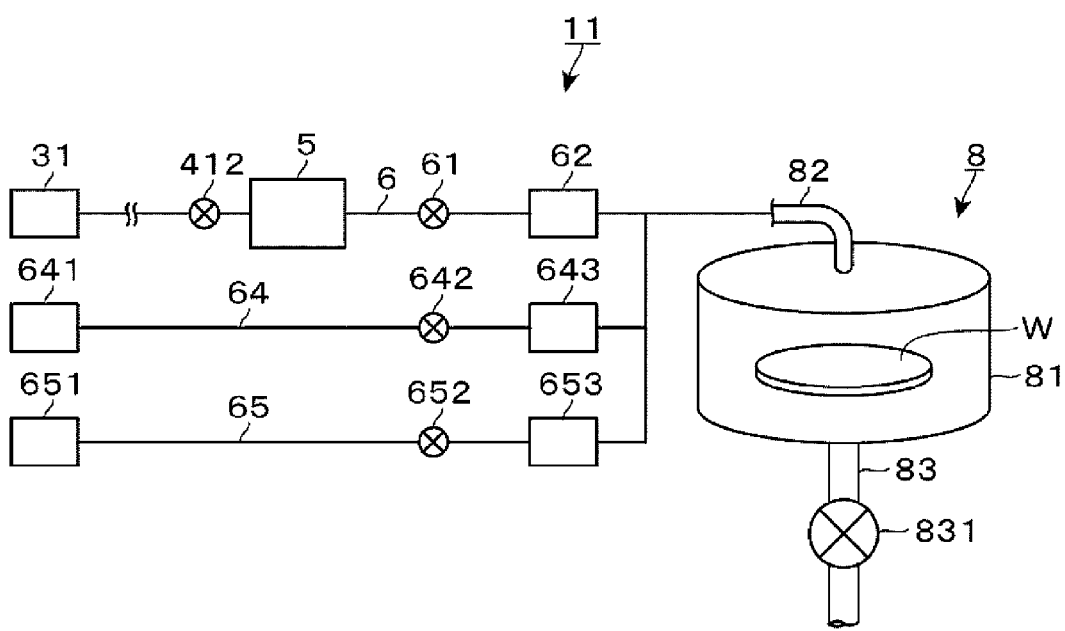
FIG. 6 is a configuration view illustrating still another example of the film forming apparatus.

FIG. 6 illustrates an example in which a chamber 81 of a film forming apparatus 8, which is a single wafer type, is connected to the gas supply system 11 as the chamber 10 illustrated in FIG. 1. For example, in the chamber 81 including a vacuum container that has a flat cylindrical shape, the wafer W is placed on a stage (not illustrated). Further, for example, a gas introduction unit 82 is connected to a ceiling of the chamber 81, and the chamber 81 is connected to the exhaust mechanism (not illustrated) via an exhaust path 83 provided with a valve 831.

The gas introduction unit 82 is configured to supply the concentrated raw material gas from the concentration tank 51 of the raw material gas concentrating apparatus 5 via the gas supply system 11 of the raw material gas of the present disclosure. In the embodiment described above, the gas supply system 11 is configured as the same as the configuration illustrated in FIG. 1. However, in FIG. 6, the illustration of the configuration between the carrier gas supply source 31 and the valve 412 is omitted. Further, the gas introduction unit 82 is connected to each of the supply source 641 of the reaction gas via the reaction gas supply path 64 and the supply source 651 of the purge gas via the purge gas supply path 65. Similarly to the example described with reference to FIG. 4, in the film forming apparatus 8, the raw material gas and the reaction gas are alternately supplied from the gas introduction unit 82 into the chamber 81, and a thin film containing, for example, AlN, is formed on the wafer W by the ALD method.

Figure 7:
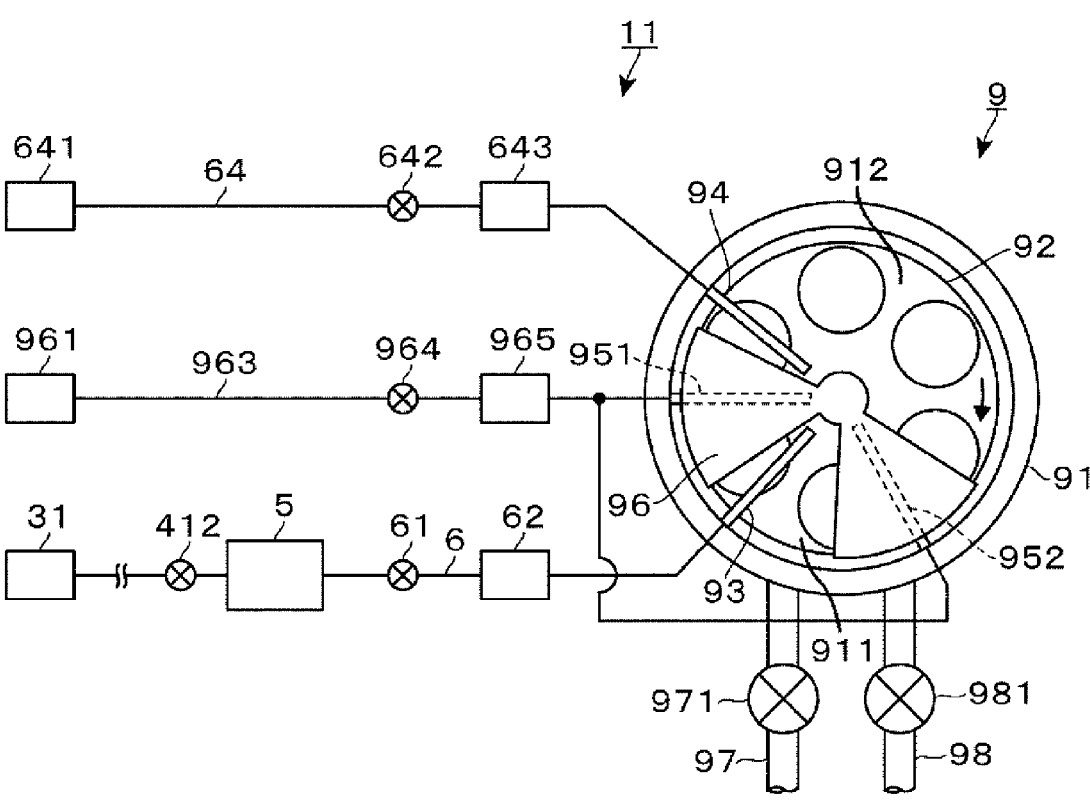
FIG. 7 is a configuration view illustrating yet another example of the film forming apparatus.

FIG. 7 illustrates an example in which a chamber 91 of a film forming apparatus 9, which is a semi-batch type, is connected to the gas supply system 11 as the chamber 10 illustrated in FIG. 1. For example, a horizontal rotary table 92 that forms a stage is provided in the chamber 91 including a vacuum container that has a flat cylindrical shape, and a plurality of wafers W is placed on the rotary table 92 so as to rotate by the rotation of the rotary table 92. Further, a raw material gas nozzle 93 configured to supply the raw material gas and a reaction gas nozzle 94 configured to supply the reaction gas are provided in a passing region of the wafer W due to the rotation of the rotary table 92. Further, two separation gas nozzles 951 and 952 configured to supply a separation gas, for example, $N_2$ gas, are provided in a region between the raw material gas nozzle 93 and the reaction gas nozzle 94, respectively. The raw material gas nozzle 93, the reaction gas nozzle 94, and the separation gas nozzles 951 and 952 are disposed to be separated from each other in the circumferential direction so as to horizontally extend from the side wall of the chamber 91 toward the center of the chamber.

In the region where the separation gas nozzles 951 and 952 are provided, for example, a partition member 96 configured to partition the space in the chamber 91 into a supply region 911 where the raw material gas is supplied and a supply region 912 where the reaction gas is supplied is provided. Therefore, the mixing of the raw material gas and the reaction gas is suppressed in the chamber 91. Further, the supply region 911 where the raw material gas is supplied and the supply region 912 where the reaction gas is supplied are connected to the exhaust mechanism (not illustrated) via exhaust paths 97 and 98 provided with valves 971 and 981, respectively.

The raw material gas nozzle 93 is configured to continuously supply the concentrated raw material gas from the concentration tank 51 of the raw material gas concentrating apparatus 5 via the gas supply system 11 of the raw material gas of the present disclosure. In the embodiment described above, the gas supply system 11 is configured as the same as the configuration illustrated in FIG. 1. However, in FIG. 7, the illustration of the configuration between the carrier gas supply source 31 and the valve 412 is omitted. Further, the reaction gas nozzle 94 is connected to the supply source 641 of the reaction gas via the reaction gas supply path 64. Further, the separation gas nozzles 951 and 952 are connected to a supply source 961 of the separation gas via a separation gas supply path 963 provided with a separation gas supply/stop valve 964 and a flow rate regulator 965.

In the film forming apparatus 9, the wafer W passes through the supply region 911 of the raw material gas as the rotary table 92 is rotated, so that the raw material gas is adsorbed to the surface of the wafer. Subsequently, the wafer W passes through the supply region 912 of the reaction gas, so that the raw material gas on the surface of the wafer and the reaction gas react with each other to form a film. In this manner, the wafer W alternately passed through the supply region 911 of the raw material gas and the supply region 912 of the reaction gas, so that a thin film containing, for example, MN is formed on the wafer W by the ALD method.

In the above, the raw material of the processing gas for processing the substrate may be a gas, and for example, a low-concentration raw material gas that needs to be concentrated by the raw material gas concentrating apparatus 5 may be used as the "raw material of the raw material gas." In this case, it is not necessary to provide a vaporization mechanism in the raw material tank and perform the step of vaporizing the raw material. Further, in the gas supply system 11 of the present disclosure that has been described with reference to FIGS. 1 to 7, the vaporization mechanism provided in the raw material tank may be a bubbling mechanism configured to bubble the carrier gas with the raw material which is liquid to vaporize the raw material. Further, the vaporization mechanism may be a mechanism configured to inject the raw material which is liquid from an injector to directly vaporize. Further, the desorption mechanism may be constituted by a decompression mechanism configured to decompress the inside of the concentration tank and desorb the raw material gas from the porous member, or may be provided with both the porous member heating mechanism and the decompression mechanism.

The combination of the raw material gas and the reaction gas is not limited to the above-described example. When a metal halide is used as the raw material, tungsten pentachloride ($WCl_5$), which is solid at normal temperature, may be used, in addition to $AlCl_3$. For example, when a film is formed on the wafer W by the ALD method using $WCl_5$ as the raw material and $NH_3$ gas as the reaction gas, it is possible to form tungsten nitride (WN). Further, an organic-metal compound, an organic compound may be used as the raw material, in addition to a metal halide.

Further, as the reaction gas that forms a film by reacting with the raw material gas, oxygen ($O_2$) gas, ozone ($O_3$) gas, hydrogen ($H_2$) gas, water vapor ($H_2O$), or hydrogen peroxide ($H_2O_2$) gas may be used, in addition to $NH_3$ gas. If necessary, the concentration tank may be used to supply these reaction gases.

The apparatus for forming a film on the substrate is not limited to the film forming apparatus illustrated in the above-described FIGS. 5 to 7, and may be applied to a film forming apparatus having another configuration. Further, in the film formation performed on the substrate for manufacturing a semiconductor device, not only the film formation processing by the ALD method is performed, but also a film formation processing by the thermal CVD method in which the raw material gas is supplied as a single substance and the film is formed by thermal decomposition may be performed. Further, the present disclosure is not limited to the film forming apparatus, but may be applied to a substrate processing apparatus such as an etching apparatus or an atomic layer etching (ALE) apparatus. In this case, in the raw material tank, a raw material of an etching gas, which is a processing gas for etching the substrate, is accommodated. Further, the substrate to which the present disclosure is applicable is not limited to the semiconductor wafer W. For example, a glass substrate for a flat panel display (FPD) may be used.

It should be considered that the embodiments disclosed in here are exemplary and not restrictive in all aspects. The above-described embodiments may be omitted, replaced, or changed in various forms without departing from the scope of accompanying claims and the gist thereof.

EXAMPLE

Subsequently, descriptions will be made on an adsorption experiment performed to evaluate the adsorption of $AlCl_3$ to the metal-organic framework that constitutes the above-described porous member 53. The experiment is performed using an apparatus accommodating two vial bottles having a volume of 4 ml inside a metal pressure-resistant container having a volume of 90 ml. First, a lid of the vial bottle is opened, and then, 1.0 g of the metal-organic framework (to be described later) is accommodated in one vial bottle, and 1.0 g of the solid $AlCl_3$ is accommodated in the other vial bottle. Next, while the lid of the vial bottle is opened, the inside of the pressure-resistant container is replaced with Ar gas, which is the carrier gas, and a lid of the pressure-resistant container is closed. Subsequently, the inside of the pressure-resistant container is heated to become approximately 125° C. in an oven for 18 hours, and the gas of $AlCl_3$ is adsorbed to the metal-organic framework. Thereafter, the vial bottle containing the metal-organic framework is weighted with an electronic balance, and a thermal gravimetric (TG) analysis is performed.

The adsorption experiment is performed on metal-organic frameworks described in (a) to (d) below.

(a) a metal-organic framework having a pore structure formed by accumulating a plurality of metal complexes each composed of a coordinate bond between a copper ion and 1,3,5-benzenetricarboxylic acid (Example 1), (b) a metal-organic framework having a pore structure formed by accumulating a plurality of metal complexes each composed of a coordinate bond between an iron ion and 1,3,5-benzenetricarboxylic acid (Example 2), (c) a metal-organic framework having a fine structure formed by accumulating a plurality of metal complexes each composed of a coordinate bond between a chromium ion and terephthalic acid (Example 3), and (d) a metal-organic framework having a pore structure formed by accumulating a plurality of the metal complexes each composed of a coordinate bond between a lanthanum ion and 1,3,5-tris(4-carboxyphenyl)benzene (Example 4).

Further, as Comparative Example of the adsorption experiment, the TG analysis of the single substance of $AlCl_3$ is also performed. In this comparative experiment, one vial bottle is provided inside the pressure-resistant container, the same amount of the solid $AlCl_3$ is accommodated in the vial bottle, and the TG analysis is executed in the same manner as in the above-described adsorption experiment.

Figure 8:
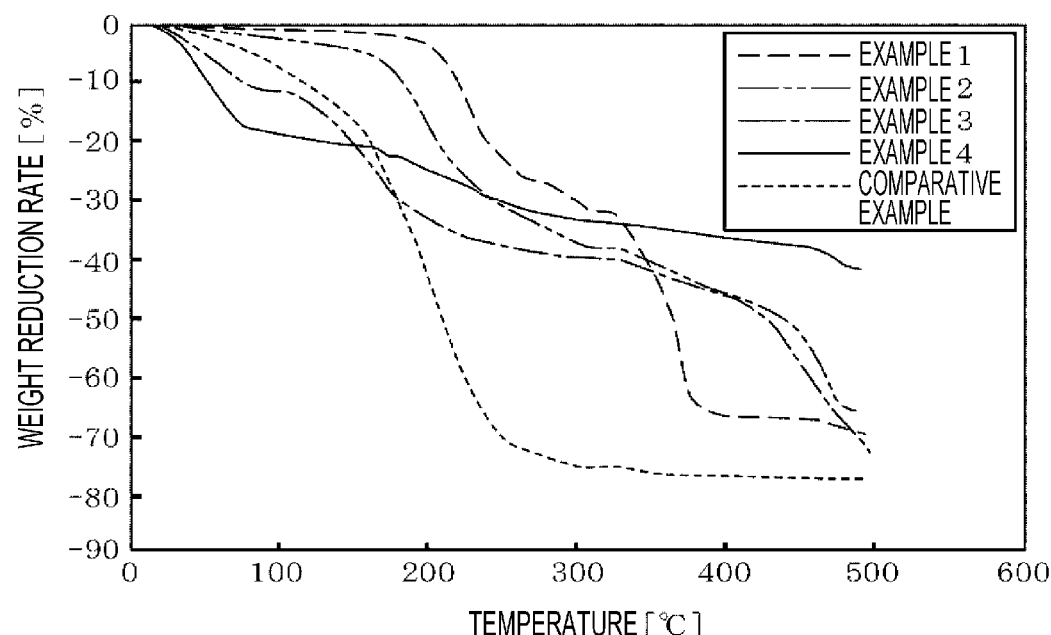
FIG. 8 is a characteristic view illustrating results of an evaluation test of the porous member.

FIG. 8 illustrates the results of the evaluation test. In FIG. 8, the horizontal axis indicates the temperature, and the vertical axis indicates the weight reduction rate. Further, the results are illustrated by a coarse broken line for Example 1, a two-dot chain line for Example 2, a one-dot chain line for Example 3, a solid line for Example 4, and a fine broken line for Comparative Example, respectively. As a result, it is confirmed that the weight reduction rate increases as the temperature increases in all Examples 1 to 4, $AlCl_3$ is adsorbed to the metal-organic framework, and the adsorbed $AlCl_3$ is desorbed by heating the metal-organic framework.

Further, since the method of changing the weight reduction rate is different depending on the types of the metal-organic framework, it is understood that, for example, the size of the pores or the ease of the adsorption of $AlCl_3$ is different from the metal-organic frameworks. From this, it is presumed that the metal-organic framework has a high degree of freedom in designing, and an appropriate metal-organic framework may be designed and manufactured according to the gas which is an adsorption target.

Further, in the case of the single substance of $AlCl_3$, which is Comparative Example, it is acknowledged that the weight reduction rate increases sharply at a temperature of 125° C. or higher, which indicates that the vaporization is in progress. Meanwhile, in Example 3 and Example 4, an increase in the weight reduction rate is seen at a temperature lower than 125° C. From this, it is acknowledged that, when the metal-organic frameworks of Example 3 and Example 4 are used, $AlCl_3$ may be desorbed at the temperature lower than 125° C., for example, 80° C. to 90° C. Therefore, it is understood that, when $AlCl_3$ is used as the raw material, it is desirable to use the metal-organic frameworks of Example 3 and Example 4 as the porous member 53. Further, the adsorption and the desorption of $AlCl_3$ to the metal-organic framework are confirmed in the metal-organic frameworks according to Example 1 and Example 2. From this, it may be seen that there is a possibility that, when there is a metal halide, an organic-metal compound, or an organic compound that may be desorbed at a lower temperature in addition to $AlCl_3$, these substances may be preferentially adsorbed.

DESCRIPTION OF SYMBOLS

10: chamber
2: raw material tank
22: vaporization mechanism
4: mixed gas flow path
5: raw material gas concentrating apparatus
51: concentration tank
52: desorption mechanism
53: porous member
6: concentration gas flow path
W: semiconductor wafer

What is claimed is:
1. A substrate processing apparatus comprising:
a chamber configured to accommodate a substrate;
a raw material tank configured to store a raw material of a processing gas for processing the substrate;
a carrier gas supply configured to supply a carrier gas to the raw material tank;
a mixed gas flow path connected to the raw material tank, and configured to allow a mixed gas of the processing gas obtained from the raw material of the processing gas and the carrier gas to flow therethrough;
a concentration tank connected to a downstream of the mixed gas flow path, the concentration tank having an internal space in which a porous member is disposed, the porous member being composed of a metal-organic framework configured such that the processing gas contained in the mixed gas is preferentially adsorbed, and the metal-organic framework containing a metal complex composed of a coordinate bond between a metal ion and organic compounds, and comprising a structure in which nanometer-sized pores formed by aggregation of a plurality of metal complexes are regularly and sterically arranged;
a mixed gas supply stop valve provided in the mixed gas flow path and configured to supply the mixed gas to the concentration tank and stop the supply;
a desorption mechanism including a first heater and configured to desorb the processing gas adsorbed to the porous member;
a concentration gas flow path provided between the concentration tank and the chamber, and configured to allow the processing gas desorbed from the porous member to flow to the chamber;
a processing gas supply stop valve provided in the concentration gas flow path;
a discharge path branched from the concentration gas flow path at an upstream side of the processing gas supply stop valve and configured to discharge the carrier gas;
a carrier gas discharging valve provided in the discharge path; and
a controller configured to control an overall operation of the substrate processing apparatus,
wherein the controller is configured to open the mixed gas supply stop valve and the carrier gas discharging valve, close the processing gas supply stop valve, and circulate the mixed gas from the raw material tank to the concentration tank so as to adsorb the processing gas included in the mixed gas to the porous member, and
the controller is configured to close the mixed gas supply stop valve and the carrier gas discharging valve, open the processing gas supply stop valve, and supply a concentration gas containing the processing gas to the chamber so as to adsorb the processing gas to a surface of the substrate.

2. The substrate processing apparatus according to claim 1, wherein the raw material is liquid or solid, and
the raw material tank includes a vaporization mechanism including a second heater and configured to vaporize the raw material of the processing gas to obtain the processing gas.

3. The substrate processing apparatus according to claim 1, wherein the desorption mechanism is configured to heat the porous member in the concentration tank to desorb the processing gas.

4. The substrate processing apparatus according to claim 1, wherein the metal-organic framework is selected from the group consisting of metal-organic frameworks described in (a) to (d) below:
(a) a metal-organic framework having a fine pore structure formed by accumulating a plurality of metal complexes each composed of a coordinate bond between a copper ion and 1,3,5-benzenetricarboxylic acid,
(b) a metal-organic framework having a fine pore structure formed by accumulating a plurality of metal complexes each composed of a coordinate bond between an iron ion and 1,3,5-benzenetricarboxylic acid, (c) a metal-organic framework having a fine pore structure formed by accumulating a plurality of metal complexes each composed of a coordinate bond between a chromium ion and terephthalic acid, and (d) a metal-organic framework having a fine pore structure formed by accumulating a plurality of metal complexes each composed of a coordinate bond between a lanthanum ion and 1,3,5-tris (4-carboxyphenyl) benzene.

5. The substrate processing apparatus according to claim 1, wherein the concentration gas flow path includes a flow rate regulator configured to regulate a flow rate of the processing gas.

6. The substrate processing apparatus according to claim 2, wherein the vaporization mechanism is configured to bubble the carrier gas to the raw material that is in a liquid state, thereby vaporizing the raw material.

7. The substrate processing apparatus according to claim 1, wherein the substrate processing apparatus is used to form a film on the substrate, and the raw material is a metal halide which is a raw material of the film.

8. The substrate processing apparatus according to claim 7, wherein the metal halide is selected from a metal halide group consisting of aluminum chloride, tungsten pentachloride, and titanium tetrachloride.

9. The substrate processing apparatus according to claim 7, further comprising:

a reaction gas supply configured to supply a reaction gas that reacts with the processing gas to form the film and including a reaction gas supply stop valve configured to supply the reaction gas to the chamber and stop the supply, wherein the controller is configured to control the processing gas supply stop valve and the reaction gas supply stop valve such that the processing gas and the reaction gas are alternately supplied to the chamber.

10. The substrate processing apparatus according to claim 1, wherein the desorption mechanism is configured to decompress an inside of the concentration tank and desorb the processing gas from the porous member.

11. The substrate processing apparatus according to claim 1, wherein the concentration tank is plural, and the controller is configured to sequentially switch a plurality of concentration tanks connected to the concentration gas flow path to supply the processing gas to the chamber while other concentration tanks adsorb the processing gas into the porous member.

* * * * *